United States Patent
Lin et al.

(10) Patent No.: US 8,872,342 B2
(45) Date of Patent: Oct. 28, 2014

(54) BARRIER LAYER FOR COPPER INTERCONNECT

(71) Applicant: Taiwan Semiconductor Manufacturing Company, Ltd., Hsin-Chu (TW)

(72) Inventors: Yu-Hung Lin, Taichung (TW); Chi-Yu Chou, Zhubei (TW); Kuei-Pin Lee, New Taipei (TW); Chen-Kuang Lien, Kaohsiung (TW); Yu-Chang Hsiao, Taipei (TW); Yao-Hsiang Liang, Hsin-Chu (TW); Yu-Min Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/204,347

(22) Filed: Mar. 11, 2014

(65) Prior Publication Data

US 2014/0191402 A1    Jul. 10, 2014

Related U.S. Application Data

(62) Division of application No. 13/666,792, filed on Nov. 1, 2012, now Pat. No. 8,722,531.

(51) Int. Cl.
*H01L 23/48* (2006.01)
*H01L 23/532* (2006.01)

(52) U.S. Cl.
CPC ............ *H01L 23/53238* (2013.01)
USPC .............. 257/751; 257/761; 257/762

(58) Field of Classification Search
USPC ......... 257/750, 751, 752, 753, 758, 761, 762
See application file for complete search history.

(56) References Cited

U.S. PATENT DOCUMENTS

| | | | |
|---|---|---|---|
| 6,952,052 B1 * | 10/2005 | Marathe et al. | 257/758 |
| 8,742,581 B2 * | 6/2014 | Yang et al. | 257/751 |
| 2005/0098897 A1 * | 5/2005 | Edelstein et al. | 257/762 |
| 2006/0199386 A1 * | 9/2006 | Huang et al. | 438/687 |
| 2010/0155951 A1 | 6/2010 | Koike et al. | |
| 2011/0027985 A1 | 2/2011 | Tsumura et al. | |
| 2013/0178058 A1 | 7/2013 | Edelstein et al. | |
| 2013/0244424 A1 | 9/2013 | Edelstein et al. | |

* cited by examiner

*Primary Examiner* — Kevin M Picardat
(74) *Attorney, Agent, or Firm* — Slater & Matsil, L.L.P.

(57) ABSTRACT

A device including a dielectric layer overlying a substrate, a conductive line with a sidewall in the dielectric layer, a Ta layer adjoining the sidewall of the conductive line, and a metal oxide formed between the Ta layer and the dielectric layer.

22 Claims, 8 Drawing Sheets

US 8,872,342 B2

BARRIER LAYER FOR COPPER INTERCONNECT

CROSS-REFERENCE TO RELATED APPLICATIONS

This application is a divisional of co-pending U.S. patent application Ser. No. 13/666,792, filed on Nov. 1, 2012, entitled "Barrier Layer for Copper Interconnect," which application is hereby incorporated herein by reference.

TECHNICAL FIELD

The present invention relates to semiconductor devices, and particularly to copper interconnects and methods for their fabrication.

BACKGROUND

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. To reduce the RC time delay, low dielectric constant (low-k) materials are being used as insulating materials, and there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Combining copper interconnects with low-k dielectric materials increases interconnect speed by reducing the RC time delay, for example.

Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, especially some types of low-k dielectric materials, a diffusion barrier layer is usually deposited on the inner walls of the damascene opening before the copper is formed. Refractory metals such as tantalum (Ta) or titanium (Ti), or nitride compounds of these metals are used as materials of the diffusion barrier layer. However, there are some challenges in using refractory metals in the copper damascene structure since these metallic films have high resistance, thereby causing increased resistance in the copper lines and increased RC delay, especially in small, narrow features.

As the shrinkage of copper lines has progressed in recent years, there is a trend towards thinner films being used for the diffusion barrier layer. Physical vapor deposition (PVD) process used for depositing a thinner TaN/Ta barrier layer encounters difficulties in advanced scale of interconnection. Atomic layer deposition (ALD) process is the candidate to deposit a very thin diffusion barrier layer with uniform coverage, but the ALD method is disadvantageous in extremely low deposition rate and poor throughput. In addition, in manufacturing the TaN/Ta film, a problem occurs in which favorable adhesion between diffusion barrier layer and the IMD layer cannot be achieved. For example, copper lines peel off at the interface, worsening the yield of the semiconductor device.

Therefore, there is a need for an improved diffusion barrier layer in the copper interconnect, and a method of forming thereof.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion

DETAILED DESCRIPTION

Figure 1:
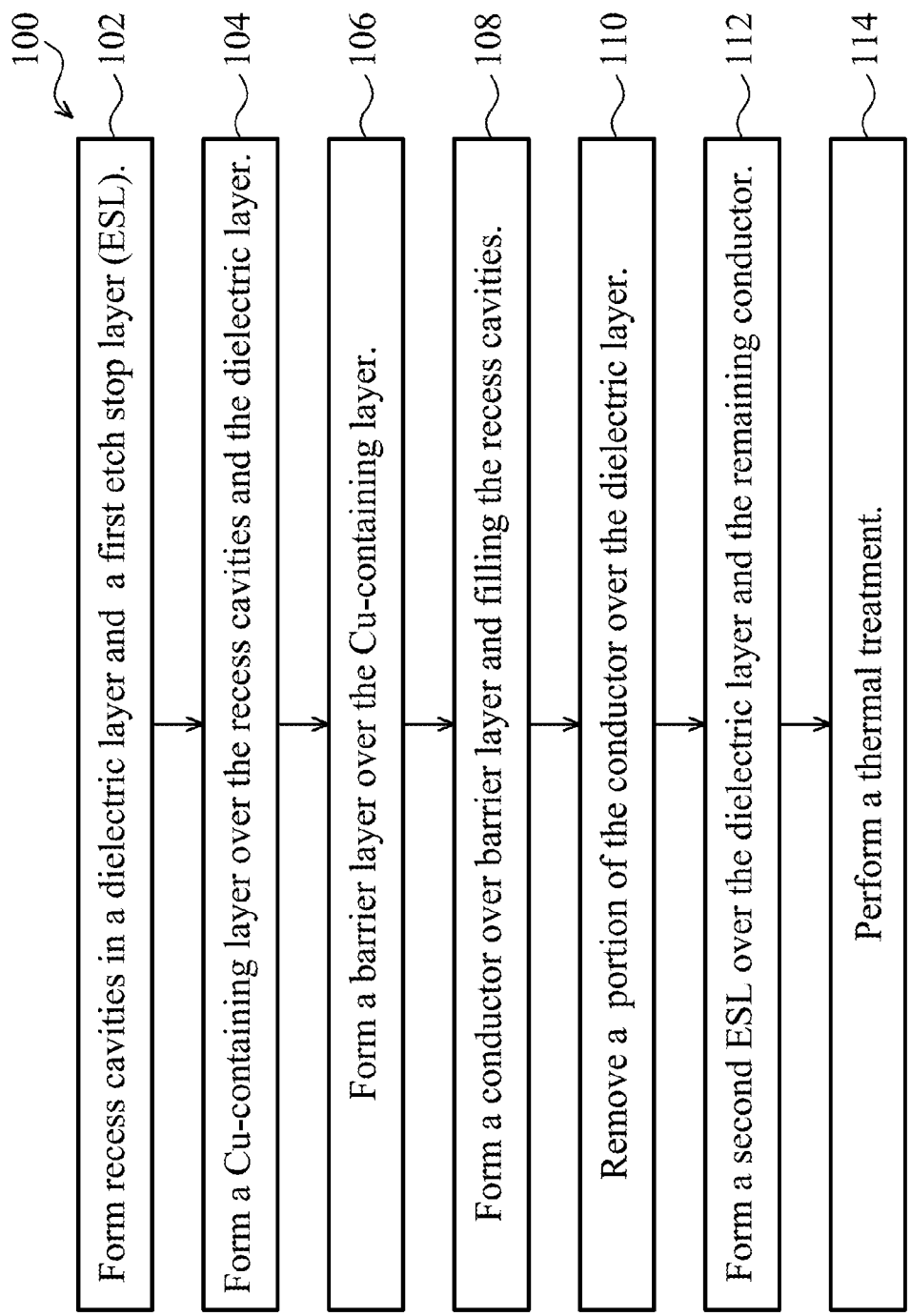
FIG. 1 is a flowchart illustrating a method for fabricating a semiconductor device comprising an interconnect according to various aspects of the present disclosure.

Embodiments provide a barrier layer formed in a copper interconnect structure of a semiconductor device and methods of forming thereof, which has wide applicability to many manufacturers, factories and industries, including integrated circuit fabrications, microelectronic fabrications, and optical electronic fabrications. Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

FIG. 1 is a flowchart illustrating a method 100 for fabricating a semiconductor device 200 according to various aspects of the present disclosure. FIGS. 2-8 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 8 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
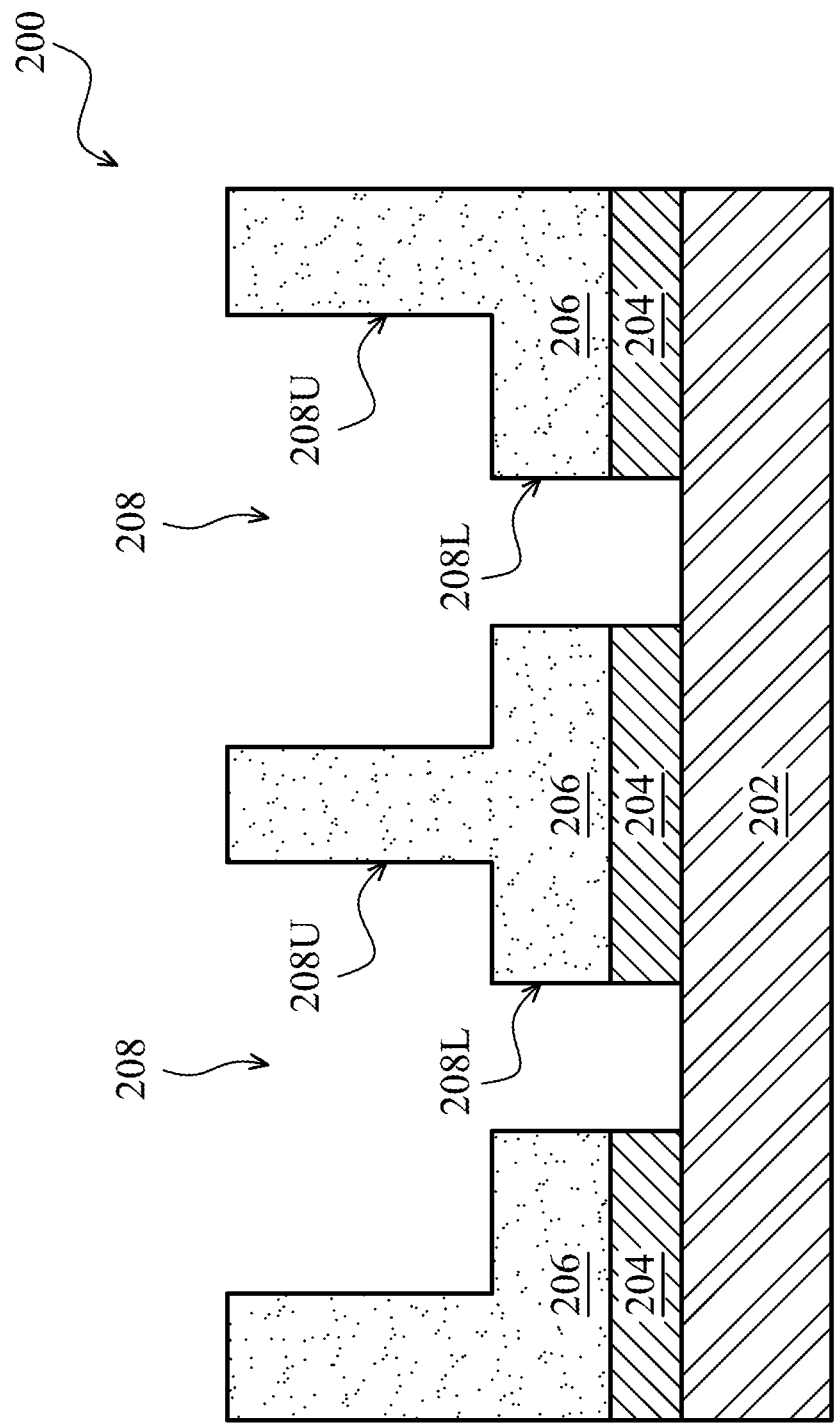
FIGS. 2-8 show schematic cross-sectional views of an interconnect structure of a semiconductor device at various stages of fabrication according to various aspects of the present disclosure.

Referring to FIGS. 1 and 2, the method 100 begins at step 102 wherein recess cavities 208 are formed in a dielectric layer 206. In some embodiments, the dielectric layer 206 is referred to an inter-metal dielectric (IMD) layer. In some embodiments, a first etch stop layer 204 is formed over a semiconductor substrate 202 and under the dielectric layer 206. In some embodiments, the recess cavities 208 are formed in the dielectric layer 206 and the first etch stop layer 204. The semiconductor substrate 202 is a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. A conductive region formed in and/or on the semiconductor substrate 202 is a portion of conductive routes and has exposed surfaces that may be treated by a planarization process, such as chemical mechanical polishing. Suitable materials for the conductive regions may include, but not limited to, for example copper, aluminum, copper alloy, or other mobile conductive materials. Copper interconnect level may be the first or any subsequent metal interconnect level of the semiconductor device.

In some embodiments, the first etch stop layer 204 functions for controlling the end point during subsequent etching processes. In some embodiments, the first etch stop layer 204 is formed of silicon oxide, silicon nitride, silicon carbide, silicon oxynitride or combinations thereof. In some embodiments, the first etch stop layer 204 has a thickness of about 10 angstroms to about 1000 angstroms. The first etch stop layer 204 is formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The dielectric layer 206 may be a single layer or a multi-layered structure. In some embodiments, the dielectric layer 206 with a thickness varies with the applied technology, for example a thickness of about 1000 angstroms to about 30000 angstroms. In some embodiments, the dielectric layer 206 is silicon oxide, carbon-doped silicon oxide, a comparatively low dielectric constant (k value) dielectric material with a k value less than about 4.0, or combinations thereof. In some embodiments, the dielectric layer 206 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 206 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 206 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 206 is a silicon-containing and nitrogen-containing dielectric layer. In another embodiment, the dielectric layer 206 is a silicon-containing and carbon-containing dielectric layer. In other embodiment, the dielectric layer 206 is a silicon-containing, nitrogen-containing, and carbon-containing dielectric layer. In one embodiment, the dielectric layer 206 has a ratio by weight of carbon to silicon about equal or greater than 0.5. In another embodiment, the dielectric layer 206 has a ratio by weight of nitrogen to silicon about equal or greater than 0.3. In other embodiment, the dielectric layer 206 has a ratio by weight of carbon to silicon about equal or greater than 0.5 and a ratio by weight of nitrogen to silicon about equal or greater than 0.3.

The recess cavities 208 are exemplary dual damascene openings including an upper trench section 208U and a lower via-hole section 208L patterned in the dielectric layer 206 and the first etch stop layer 204 to define a contact region on the semiconductor substrate 202. Although the embodiments illustrate dual damascene openings in the IMD layer, the use of single damascene openings in the IMD layer also provide values. In dual damascene techniques including a "via-first" patterning method or a "trench-first" patterning method, the upper trench section 208U and the lower via-hole section 208L may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 206, providing a clear indicator of when to end a particular etching process.

Figure 3:
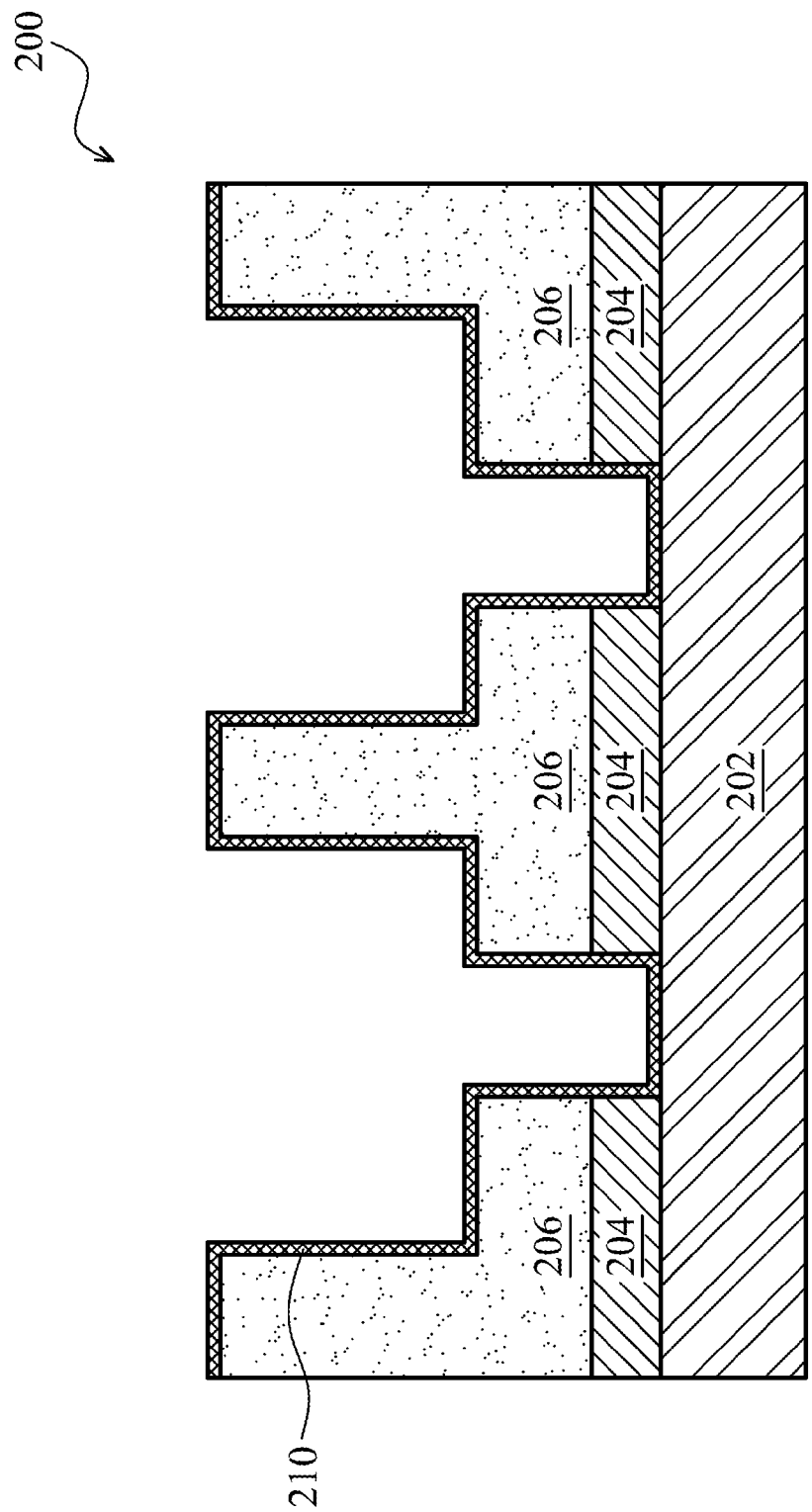

Referring to FIGS. 1 and 3, the method 100 proceeds to step 104 wherein a copper-containing (Cu-containing) layer 210 is formed on the above-described structure to line the sidewalls and bottoms of the recess cavities 208 and over the dielectric layer 206. In one embodiment, the Cu-containing layer 210 is a metal alloy layer containing at least a main metal element, copper (Cu), and an additive metal element. In some embodiments, the additive metal element includes manganese (Mn), aluminum (Al), titanium (Ti), niobium (Nb), chromium (Cr), vanadium (V), yttrium (Y), technetium (Tc), rhenium (Re), cobalt (Co), or combinations thereof.

In some embodiments, the Cu-containing layer 210 is copper-manganese (CuMn) layer with a crystal structure of face center cubic (FCC). In some embodiments, a ratio of manganese to copper contained in the CuMn layer is ranging from about 0.05% to about 10.00%. In some embodiments, the Cu-containing layer 210 has a thickness of about 1 angstrom to about 150 angstroms. In some embodiments, the Cu-containing layer 210 has a thickness ranging from about 5 angstroms to about 50 angstroms. In some embodiments, the Cu-containing layer 210 is deposited by using physical vapor deposition (PVD), chemical vapor deposition (CVD), plasma enhanced CVD (PECVD), low pressure CVD (LPCVD), or other well-known deposition techniques.

Figure 4:
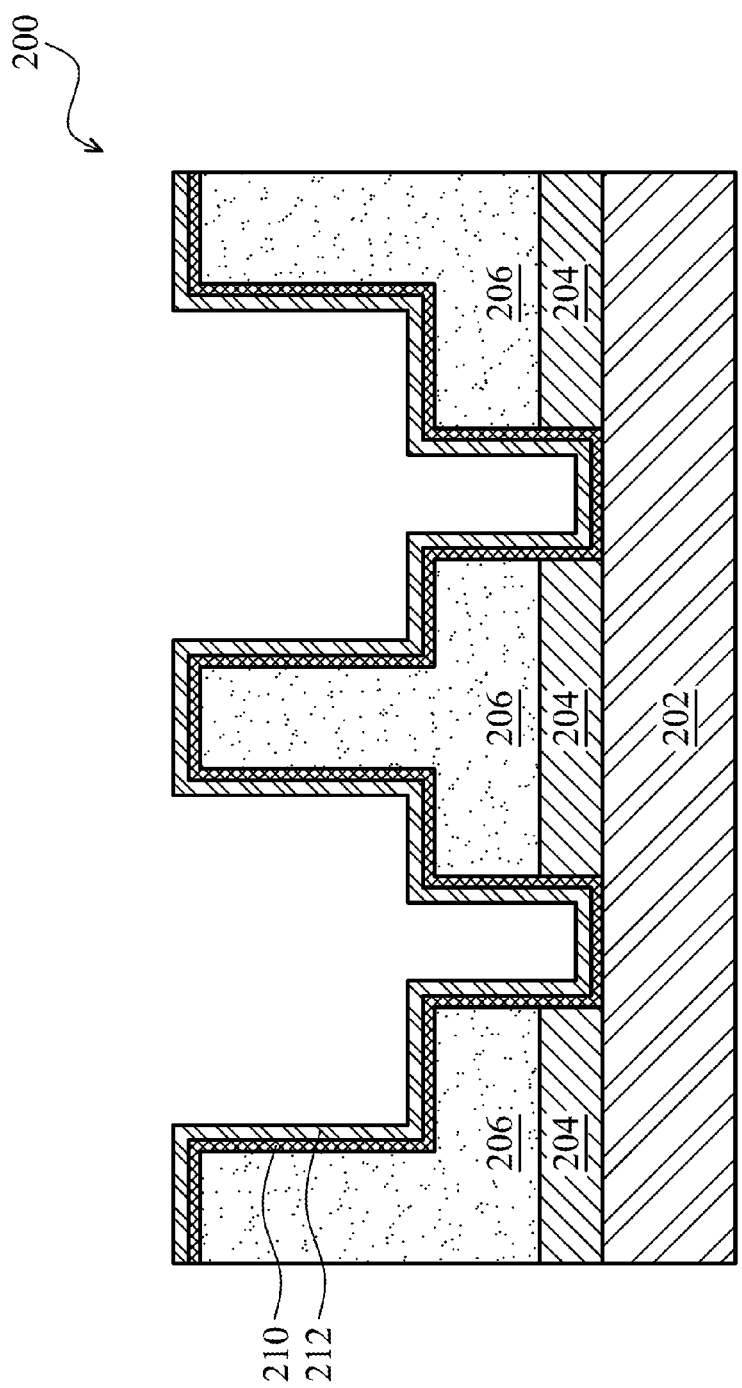

Referring to FIGS. 1 and 4, the method 100 proceeds to step 106 wherein a barrier layer 212 is formed over the Cu-containing layer 210. The barrier layer 212 may function as a barrier to prevent a subsequently formed conductor from diffusing into the underlying dielectric layer 206. In some embodiments, the barrier layer 212 includes tantalum (Ta), titanium (Ti) or the like. In some embodiments, the barrier layer 212 has a thickness of about 10 angstrom to about 250 angstroms. In some embodiments, a combined thickness of the Cu-containing layer 210 and the barrier layer 212 is less than about 120 angstroms to prevent a gap filling issue during the subsequent opening filling process. There are two different phases for Ta layer, including α phase tantalum (α-Ta) layer with a body center cubic (BCC) phase and β phase tantalum (β-Ta) layer with a tetragonal phase. The α-Ta layer has a resistivity lower than a resistivity of the β-Ta layer. It tends to form a α-Ta layer if the underlying layer has a crystal structure.

In some embodiments, the barrier layer 212 is α-Ta layer. In some embodiments, the barrier layer 212 has a resistivity less than about 60 μΩ/cm. Therefore, a low resistance of the barrier layer 212 can be achieved to decrease a RC delay issue. In alternative embodiments, the barrier layer 212 is a Ta layer with α phase and/or β phase. In some embodiments, the barrier layer 212 is deposited by using PVD, CVD, PECVD, LPCVD, or other well-known deposition techniques.

Figure 5:
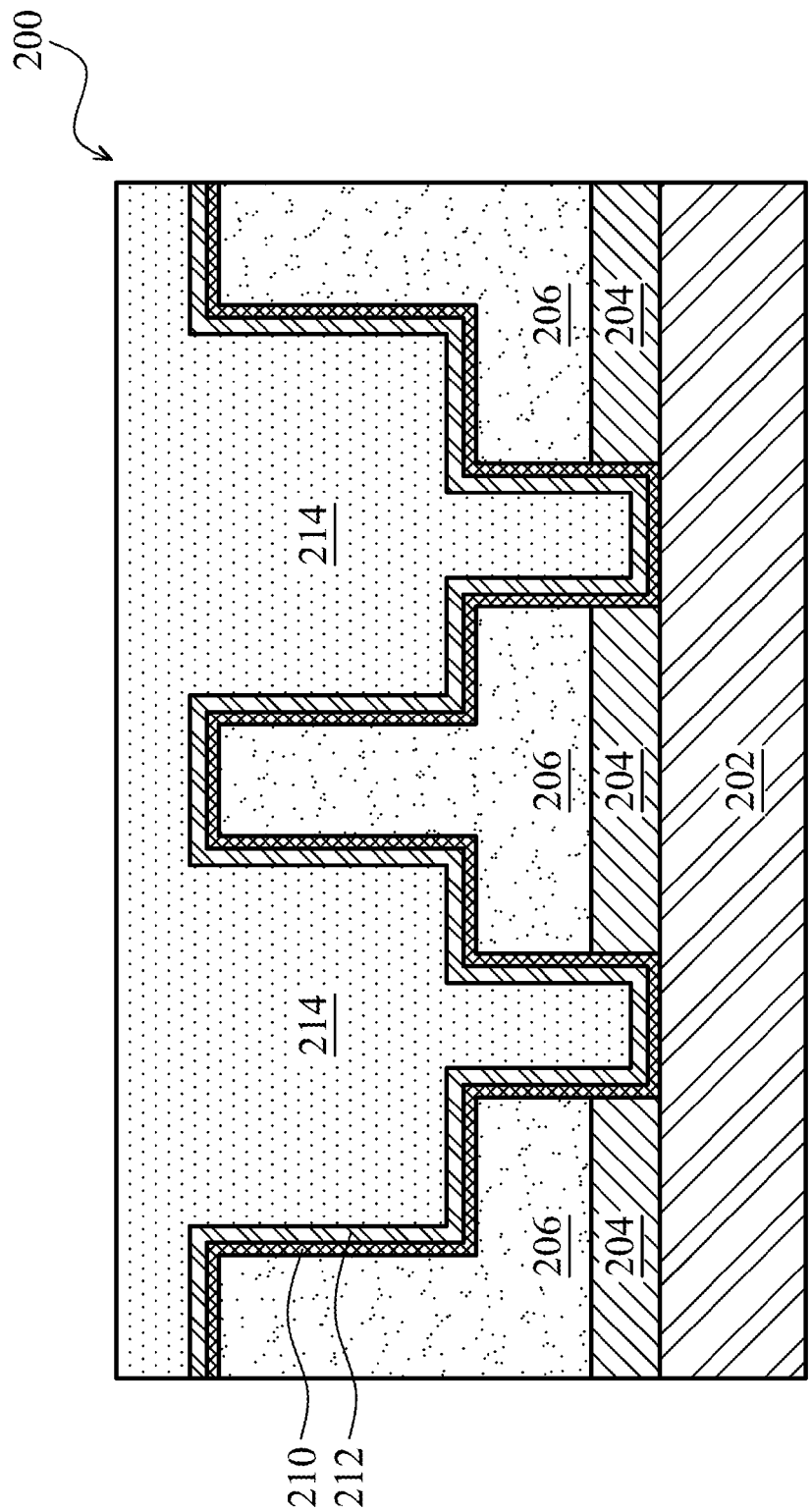

Referring to FIGS. 1 and 5, the method 100 proceeds to step 108 wherein a conductor 214 is formed over the barrier layer 212 to fill the recess cavities 208. In some embodiments, the conductor 214 is formed as an interconnect structure in the dielectric layer 206. In some embodiments, the conductor 214 is deposited by an electro-chemical plating (ECP) process. In some embodiments, the conductor 214 at least contains the main metal element, e.g., copper (Cu). In some embodiments, the conductor 214 further contains an additive metal element. In some embodiments, the conductor 214 contains an additive metal element different from the additive metal element in the Cu-containing layer 210. In some embodiments, the additive metal element in the conductor 214 is tantalum, indium, tin, zinc, manganese, chromium, titanium, germanium, strontium, platinum, magnesium, aluminum or zirconium.

In some embodiments, a conductive seed layer (not shown) is formed before forming the conductor 214. In some embodiments, the conductive seed layer at least contains the main metal element, e.g., copper (Cu), as contained in the conductor 214. In some embodiments, the conductive seed layer is a Cu-containing layer, such as CuAl, CuMn, or the like.

Figure 6:
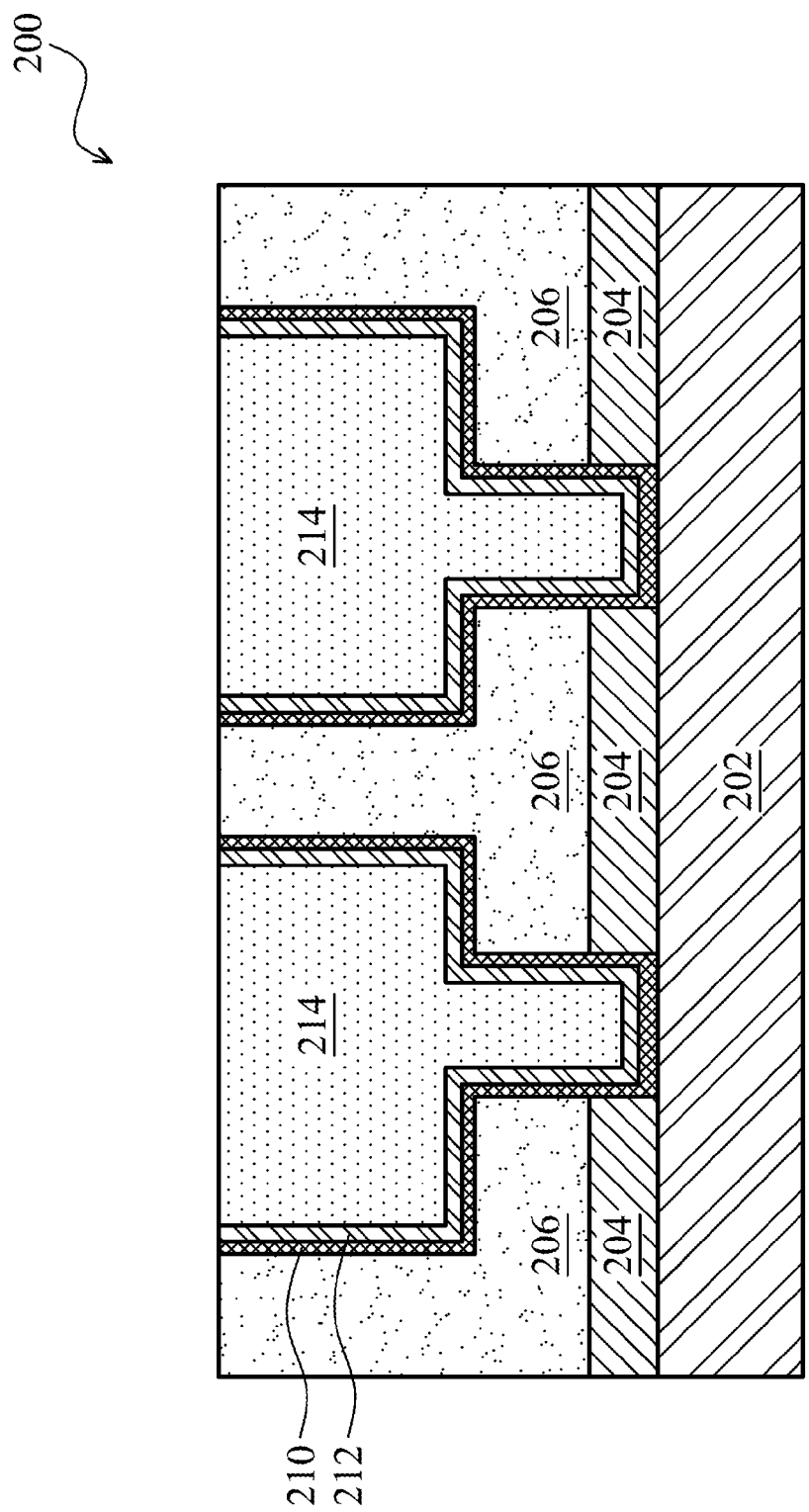

Referring to FIGS. 1 and 6, the method 100 proceeds to step 110 wherein the portion of conductor 214 over the dielectric layer 206 is removed. In some embodiments, the removing process is chemical mechanical polishing (CMP) process performed to remove the excess portions of the conductor 214, the conductive seed layer, the barrier layer 212, and the Cu-containing layer 210 outside the recess cavities 208, thus exposing the top surface of the dielectric layer 206 and achieving a planarized surface.

Figure 7:
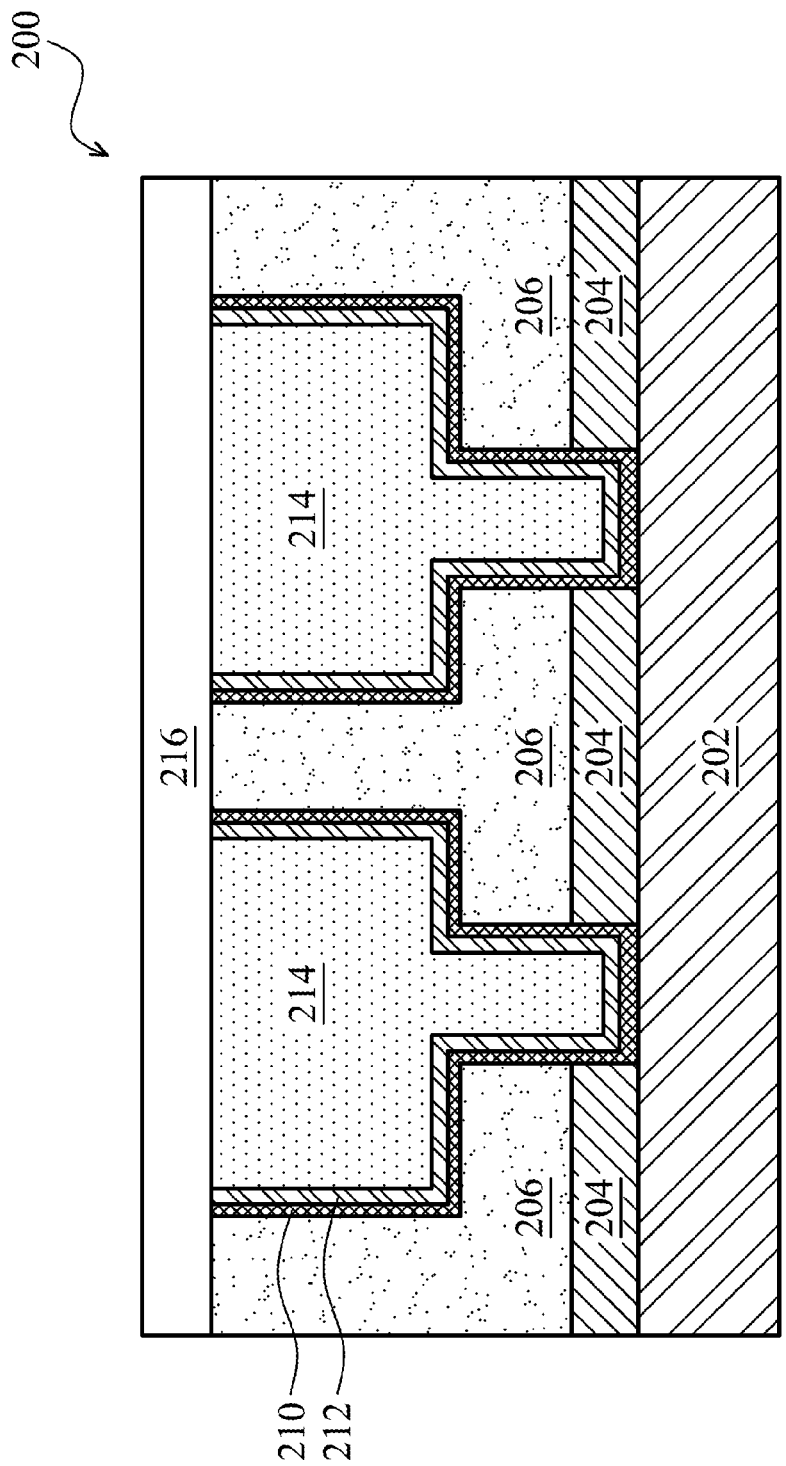

Referring to FIGS. 1 and 7, the method 100 proceeds to step 112 wherein a second etch stop layer 216 is formed on the above-described planarized surface. The second etch stop layer 216 may control the end point during subsequent etching processes. In some embodiments, the second etch stop layer 216 is formed of silicon oxide, silicon nitride, silicon carbide, silicon oxynitride or combinations thereof. In some embodiments, the second etch stop layer 216 has a thickness of about 10 angstroms to about 1000 angstroms. In some embodiments, the second etch stop layer 216 is formed through any of a variety of deposition techniques, including LPCVD APCVD, PECVD, PVD, and sputtering.

Figure 8:
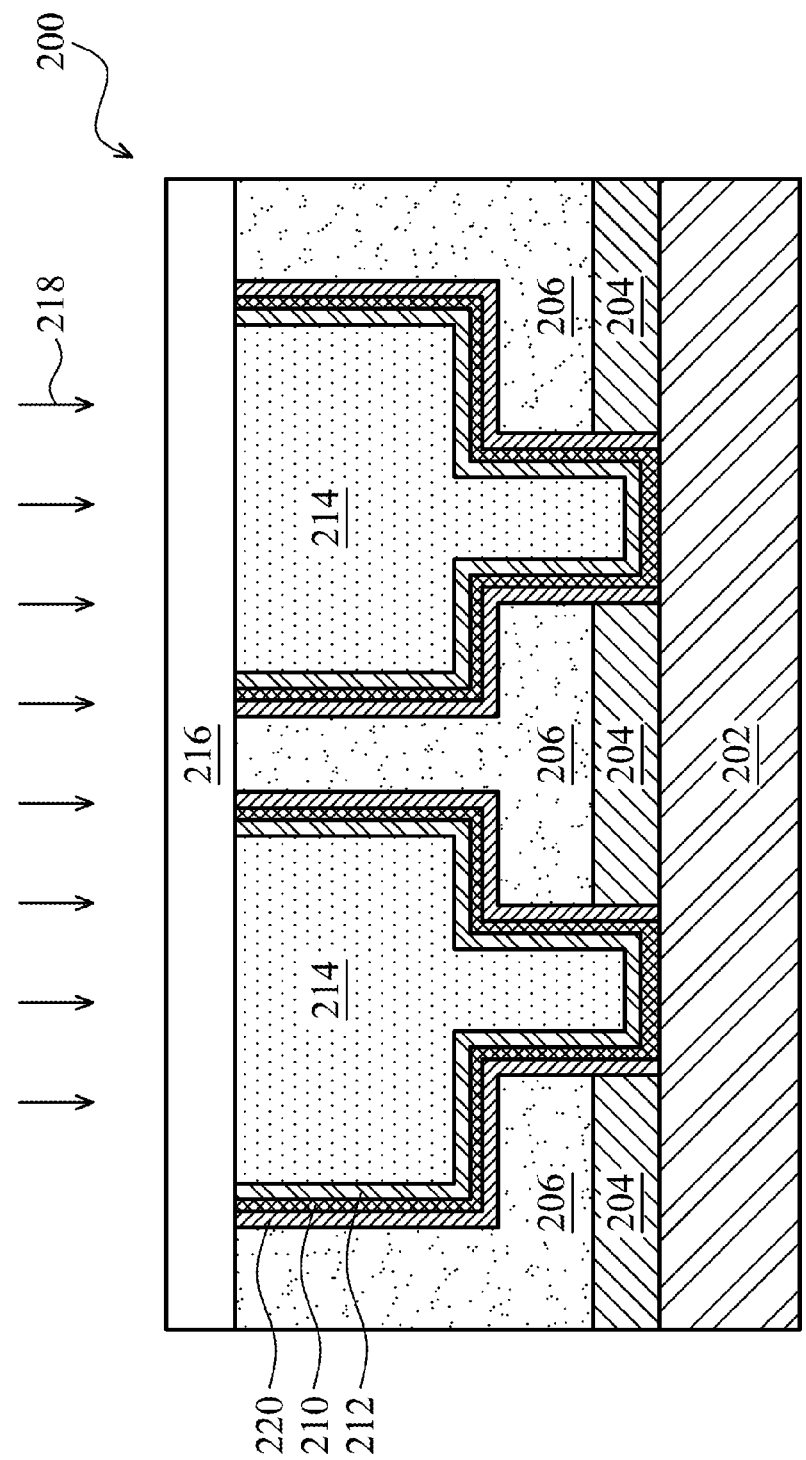

Referring to FIGS. 1 and 8, the method 100 proceeds to step 114 wherein a thermal treatment 218 is performed on the semiconductor substrate 202. In some embodiments, the thermal treatment 218 includes an annealing process. In one embodiment, the thermal treatment 218 is performed at a temperature ranged from about 137° C. to about 600° C. In another embodiment, the thermal treatment 218 is performed at a temperature ranged from about 280° C. to about 400° C. In one embodiment, the thermal treatment 218 is performed at a duration ranged from about 10 min. to about 600 min. In some embodiments, the thermal treatment 218 is performed using furnace, rapid thermal processing (RTP), or hot plate equipment.

During and/or after the annealing process, in some embodiments, the additive metal element in the Cu-containing layer 210 partially or completely diffuses to the surface of the dielectric layer 206. In some embodiments, the diffused additive metal element reacts with the dielectric layer 206 to form a diffusion barrier layer 220. The diffusion barrier layer 220 is formed in a self-aligned manner at the boundary between the dielectric layer 206 and the Cu-containing layer 210. In one embodiment, the diffusion barrier layer 220 has a thickness ranging from about 1 angstrom to about 30 angstroms. In another embodiment, the diffusion barrier layer 220 has a thickness ranging from about 1 angstrom to about 15 angstroms. In some embodiments, the formation of the diffusion barrier layer 220 consumes some of the dielectric layer 206 and the Cu-containing layer 210. In one embodiment, the diffusion barrier layer 220 is a metal oxide layer because the oxygen existed in the dielectric layer 206 reacts with the additive metal element in the Cu-containing layer 210 during the annealing process. In some embodiments, the metal oxide layer is MnOx and/or MnSiyOz. In alternative embodiments, the metal oxide layer is TiOx, AlOx, CoOx, VOx, YOx, TcOx, ReOx, or combinations thereof. In some embodiments, the diffusion barrier layer 220 has a weight ratio of manganese to oxygen from about 0.1 to about 10. The diffusion barrier layer 220 may function as a protector to prevent the conductor 214 diffusing into the dielectric layer 206.

After the annealing process, the Cu-containing layer 210 is transformed to be a post Cu-containing layer 210'. In one embodiment, the post Cu-containing layer 210' contains the main metal element and the additive metal element remained therein, wherein the content of the additive metal element in the post Cu-containing layer 210' is less than the content of the additive metal element in the Cu-containing layer 210. In another embodiment, the post Cu-containing layer 210' contains the main metal element but without the additive metal element because the additive metal element has been consumed entirely after the annealing process.

The step of thermal treatment can be provided by any thermal processing after forming the Cu-containing layer 210. In alternative embodiments, the step of thermal treatment is provided at the time immediately after the formation of the Cu-containing layer 210, immediately after the step of CMP of removing the excess portions of the conductor 214 outside the recess cavities 208, immediately after the step of forming the second etch stop layer 216, or after the step of forming a passivation layer on a top metal layer.

A benefit of the dislocations for the semiconductor device and the interconnect structure, in accordance with the disclosed embodiments, is that the diffusion barrier layer formed in a self-aligned manner can solve the contact issue to improve package capabilities. Further, the barrier layer over the diffusion barrier layer may further prevent the interconnect conductor from diffusing into the IMD layer to ensure the package capabilities. Moreover, the barrier layer includes Ta with α phase can achieve low resistivity to decrease contact resistance. These can improve device performance.

In one embodiment, a device includes a dielectric layer overlying a substrate, a conductive line with a sidewall in the dielectric layer, a Ta layer adjoining the sidewall of the conductive line, and a metal oxide between the Ta layer and the dielectric layer.

In another embodiment, a device includes a dielectric layer overlying a substrate, an opening in the dielectric layer, a metal-containing layer overlying the opening, a barrier layer overlying the metal-containing layer, a conductive layer in the opening, and a metal oxide barrier layer underlying the conductive layer.

In still another embodiment, a device includes a dielectric layer overlying a substrate, a recess cavity in the dielectric layer, a CuMn layer overlying the recess cavity, a α phase tantalum layer overlying the CuMn layer within the recess cavity, a conductive layer overlying the α phase tantalum layer within the recess cavity, and a MnOx barrier layer underlying the conductive layer.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A device, comprising:
a dielectric layer overlying a substrate;
a conductive line with a sidewall in the dielectric layer;
a Ta layer adjoining the sidewall of the conductive line; and
a metal oxide between the Ta layer and the dielectric layer.

2. The device of claim 1, wherein the Ta layer has an α phase, BCC structure.

3. The device of claim 1, wherein the metal oxide is MnOx, TiOx, AlOx, CoOx, VOx, YOx, TcOx, ReOx, or combinations thereof.

4. The device of claim 1, further comprising a CuMn layer formed between the metal oxide and the Ta layer.

5. A device, comprising:
a dielectric layer overlying a substrate;
an opening in the dielectric layer;
a metal-containing layer overlying the opening;
a barrier layer overlying the metal-containing layer;
a conductive layer in the opening; and
a metal oxide barrier layer underlying the conductive layer.

6. The device of claim 5, wherein the barrier layer has a resistivity less than about 60 μΩ/cm.

7. The device of claim 5, wherein the metal-containing layer has a crystal structure of face center cubic (FCC) structure.

8. The device of claim 5, wherein the barrier layer has a crystal structure of body center cubic (BCC) structure.

9. The device of claim 5, wherein the metal-containing layer is a CuMn layer, a CuNb layer, a CuTi layer, a CuAl layer, a CuCo layer, a CuV layer, a CuY layer, a CuTc layer, a CuRe, or combinations thereof.

10. The device of claim 5, wherein the metal-containing layer is Cu-containing layer.

11. The device of claim 10, wherein the Cu-containing layer comprises an additive metal element including manganese (Mn), aluminum (Al), titanium (Ti), niobium (Nb), chromium (Cr), vanadium (V), yttrium (Y), technetium (Tc), rhenium (Re), cobalt (Co), or combinations thereof.

12. The device of claim 5, wherein the barrier layer is a tantalum (Ta) layer.

13. The device of claim 12, wherein the tantalum layer is an α phase tantalum layer (α-Ta) layer.

14. The device of claim 5, wherein the metal oxide barrier layer is MnOx and/or MnSiyOz.

15. The device of claim 5, wherein a combined thickness of the metal-containing layer and the barrier layer is less than about 120 angstroms.

16. A device, comprising:
a dielectric layer overlying a substrate;
a recess cavity in the dielectric layer;
a CuMn layer overlying the recess cavity;
a α phase tantalum layer overlying the CuMn layer within the recess cavity;
a conductive layer overlying the α phase tantalum layer within the recess cavity; and
a MnOx barrier layer underlying the conductive layer.

17. The device of claim 16, wherein the CuMn layer has a thickness less than about 150 angstroms.

18. The device of claim 16, wherein an etch stop layer is disposed between the dielectric layer and the substrate, and wherein the recess cavity extends into the etch stop layer.

19. The device of claim 16, wherein the recess cavity includes an upper trench section above a lower trench section, the upper trench section having a width greater than the lower trench section.

20. The device of claim 16, wherein the α phase tantalum layer has a resistivity less than about 60 μΩ/cm.

21. The device of claim 16, wherein the CuMn layer has a thickness ranging from about 5 angstroms to about 50 angstroms.

22. The device of claim 16, wherein the CuMn layer has a crystal structure.

* * * * *